United States Patent
Sun et al.

(10) Patent No.: US 11,056,819 B2
(45) Date of Patent: Jul. 6, 2021

(54) CONNECTOR AND CONNECTOR PROCESSING METHOD

(71) Applicant: Luxshare Precision Industry (Suzhou) Co., Ltd., Suzhou (CN)

(72) Inventors: Hong-Wei Sun, Suzhou (CN); Tao Wang, Suzhou (CN); Kuo-Chin Lin, Suzhou (CN)

(73) Assignee: LUXSHARE PRECISION INDUSTRY (SUZHOU) CO., LTD., Suzhou (CN)

( * ) Notice: Subject to any disclaimer, the term of this patent is extended or adjusted under 35 U.S.C. 154(b) by 0 days.

(21) Appl. No.: 16/870,097

(22) Filed: May 8, 2020

(65) Prior Publication Data

US 2020/0266571 A1 Aug. 20, 2020

(30) Foreign Application Priority Data

May 10, 2019 (CN) .......................... 201910388298.0

(51) Int. Cl.
*H01R 9/05* (2006.01)
*H01R 13/50* (2006.01)
*H01R 12/58* (2011.01)
*H01R 43/20* (2006.01)
*H05K 5/00* (2006.01)
(Continued)

(52) U.S. Cl.
CPC ............. *H01R 13/50* (2013.01); *H01R 12/58* (2013.01); *H01R 43/205* (2013.01); *H05K 5/0069* (2013.01); *H01R 13/22* (2013.01); *H01R 43/24* (2013.01)

(58) Field of Classification Search
CPC .............. H01R 2103/00; H01R 9/0518; H01R 9/0521; H01R 24/40; H01R 24/50; H01R 24/44; H01R 43/16; H01R 43/02; H01R 4/625
USPC .......................................... 439/578–585, 887
See application file for complete search history.

(56) References Cited

U.S. PATENT DOCUMENTS 3,808,578 A * 4/1974 Hansen ................ H01R 12/721
439/595
6,129,565 A * 10/2000 Lai ......................... H01R 13/04
439/101
(Continued)

FOREIGN PATENT DOCUMENTS

TW M571072 U 12/2018

*Primary Examiner* — Phuong Chi Thi Nguyen
(74) *Attorney, Agent, or Firm* — Birch, Stewart, Kolasch & Birch, LLP

(57) ABSTRACT

A connector is provided. The connector includes a shell assembly, a circuit board, a terminal, and an insulated block. The terminal includes a contact piece and a connecting piece including a connecting portion and a connecting pin, and an angle is between the connecting portion and the connecting pin. The insulated block is disposed on one side of the shell assembly, and the connecting pin passes through the insulated block to be connected to the circuit board. The connecting portion and a bending portion of the connecting piece are both embedded in the insulated block. The periphery of the contact piece is devoid of material receiving areas. The contact area of the contact piece has a pleasing appearance. Moreover, as the bending portion is completely embedded in the insulated block, insufficient molding and burr phenomenon during molding can be avoided.

11 Claims, 4 Drawing Sheets

(51) Int. Cl.
     *H01R 13/22*      (2006.01)
     *H01R 43/24*      (2006.01)

(56) References Cited

U.S. PATENT DOCUMENTS

| | | | |
|---|---|---|---|
| 6,780,066 B2 * | 8/2004 | Hasegawa | H01H 9/085 |
| | | | 439/732 |
| 6,994,596 B2 * | 2/2006 | Katsuma | H01R 13/432 |
| | | | 439/746 |
| 7,479,047 B2 * | 1/2009 | Boischio | H01R 13/055 |
| | | | 310/71 |

* cited by examiner

CONNECTOR AND CONNECTOR PROCESSING METHOD

CROSS-REFERENCE TO RELATED APPLICATION

This non-provisional application claims priority under 35 U.S.C. § 119(a) to Patent Application No. 201910388298.0 filed in China, P.R.C. on May 10, 2019, the entire contents of which are hereby incorporated by reference.

BACKGROUND

Technical Field

The instant disclosure relates to the field of connector technologies, and in particular, to a connector and a processing method thereof.

Related Art

A charging connector known to the inventor(s) includes a shell, a circuit board disposed in the shell, an insulated block, and a terminal disposed on the insulated block. A contact portion of the terminal and the insulated block are disposed on a side surface of the shell. The terminal is provided with a connecting pin formed by means of stamping and bending. The connecting pin is extending into the shell to be connected to the circuit board. After the connecting pin is formed by means of stamping and bending, the insulated block is formed by means of injection molding. Insufficient molding or burr phenomenon may often occur in the bending area of the terminal, which affects the subsequent use. In addition, the appearance requirements cannot be met.

Therefore, a connector and a processing method thereof are urgently needed to resolve the foregoing technical problems.

SUMMARY

An objective of the instant disclosure is to provide a connector and a processing method thereof, so that the contact area of the connector has a pleasing appearance, and insufficient molding and burr phenomenon during molding can also be avoided.

The instant disclosure adopts the following technical solutions to achieve this objective.

According to an embodiment, a connector is provided. The connector includes a shell assembly and a circuit board disposed in the shell assembly, and further includes:

a terminal, including a contact piece and a connecting piece, where the connecting piece includes a connecting portion and a connecting pin, an angle is between the connecting portion and the connecting pin, and the connecting portion is fixed on the back of the contact piece; and an insulated block, disposed at one side of the shell assembly, where the insulated block is provided with a groove for receiving the connecting portion and the contact piece, and the connecting pin passes through the insulated block to be connected to the circuit board.

In some embodiments, the connecting portion is fixed on the back of the contact piece by welding.

In some embodiments, the welding is laser welding, soldering, or thermal compression welding.

In some embodiments, electroplating is performed on the surface of the terminal.

According to another embodiment, a connector processing method is provided. The processing method is applied to processing of the foregoing connector and includes the following steps:

forming a contact piece and a connecting piece respectively by means of stamping, and fixing a connecting portion of the connecting piece on the back of the contact piece to form a terminal;

fixing the terminal on an insulated block by means of insert molding; and assembling the insulated block on a shell assembly, and connecting a connecting pin of the connecting piece to a circuit board, where the circuit board is assembled in the shell assembly.

In some embodiments, the connecting portion is fixed on the back of the contact piece by welding.

In some embodiments, the welding is laser welding, soldering, or thermal compression welding.

In some embodiments, before the connecting portion and the contact piece are fixed, electroplating is performed on the connecting portion and the contact piece respectively.

In some embodiments, after the connecting portion and the contact piece are fixed, electroplating is performed on the terminal.

In some embodiments, the electroplating adopts continuous plating.

The instant disclosure achieves the following beneficial effects: the connecting portion and a bending portion of the connecting piece are both embedded in the insulated block. The periphery of the contact piece is devoid of material receiving areas. The contact area of the contact piece has a pleasing appearance. Moreover, as the bending portion is completely embedded in the insulated block, insufficient molding and burr phenomenon during molding can be avoided.

DETAILED DESCRIPTION

Figure 1:
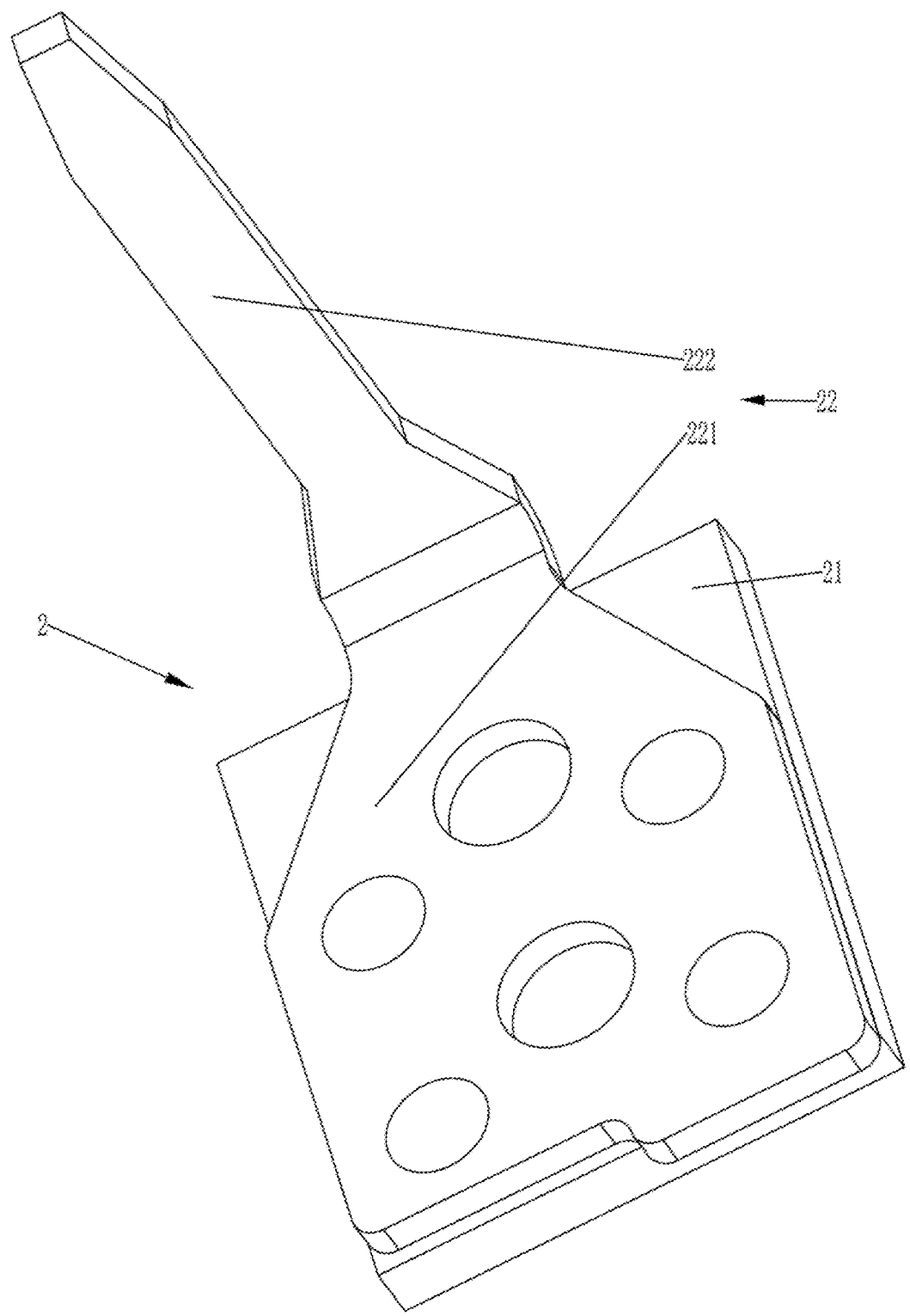
FIG. 1 is a schematic structural diagram of a terminal according to an embodiment of the instant disclosure.

In order to make the objectives, technical solutions, and advantages of the instant disclosure more comprehensible, the technical solutions according to embodiments of the instant disclosure are clearly and completely described in the following with reference to the accompanying drawings. Apparently, the embodiments in the following description are merely some rather than all of the embodiments of the instant disclosure. Components of the embodiments of the instant disclosure generally described and shown in the accompanying drawings herein may be arranged and designed in different configurations.

Therefore, the following detailed description of the embodiments of the instant disclosure provided in the accompanying drawings is not intended to limit the protection scope of the instant disclosure, but merely represents selected embodiments of the instant disclosure. All other embodiments obtained by a person of ordinary skill in the art based on the embodiments of the instant disclosure without creative efforts shall fall within the protection scope of the instant disclosure.

It should be noted that similar labels and letters represent similar items in the accompanying drawings, so that once an item is defined in one accompanying drawing, it does not need to be further defined and interpreted in subsequent accompanying drawings.

In the description of the instant disclosure, a direction or location relationship indicated by a term "above", "under", "left", "right", "vertical", "horizontal", "inner", "outer", or the like is a direction or location relationship shown based on the accompanying drawings, or a common direction or location relationship when the invention product is used, and is merely intended to facilitate the description of the instant disclosure and simplify the description, but is not intended to indicate or imply that a mentioned apparatus or assembly needs to have a particular direction and is constructed and operated in the particular direction. Therefore, the direction or location relationship cannot be understood as a limitation on the instant disclosure. In addition, terms "first", "second", and "third" are only used to distinguish the descriptions and cannot be understood as indicating or implying relative importance. In the description of the instant disclosure, unless stated otherwise, the meaning of "a plurality of" is two or more than two.

In the description of the instant disclosure, it should be noted that unless otherwise explicitly specified or defined, the terms such as "dispose" and "connection" should be understood in a broad sense. For example, the connection may be a fixed connection, a detachable connection, or an integral connection; or the connection may be a mechanical connection or an electrical connection. A person of ordinary skill in the art may understand the specific meanings of the foregoing terms in the instant disclosure according to specific situations.

In the instant disclosure, unless otherwise expressly specified and qualified, the first feature is "on" or "under" the second feature may include a direct contact between the first feature and the second feature, or may include an indirect contact between the first feature and the second feature through other features. Moreover, the first feature is "on" "above", and "over" the second feature includes that the first feature is directly above and diagonally above the second feature, or simply indicates that the horizontal height of the first feature is higher than that of the second feature. Moreover, the first feature is "down" "under", and "below" the second feature includes that the first feature is directly under and diagonally under the second feature, or simply indicates that the horizontal height of the first feature is lower than that of the second feature.

The following describes the embodiments of the instant disclosure in detail. Examples of the embodiments are shown in the accompanying drawings, and same or similar reference signs in all the accompanying drawings indicate same or similar components or components having same or similar functions. The embodiments that are described with reference to the accompany drawings are exemplary, and are only used to interpret the instant disclosure, instead limiting the instant disclosure.

As shown in FIG. 1 to FIG. 4, this embodiment discloses a connector, including a shell assembly, a circuit board (not shown in the figure), a terminal 2 and an insulated block 3. The circuit board is disposed in the shell assembly.

As shown in FIG. 1, the terminal 2 includes a contact piece 21 and a connecting piece 22. The connecting piece 22 includes a connecting portion 221 and a connecting pin 222, and an angle is between the connecting portion 221 and the connecting pin 222. The connecting portion 221 is fixed on the back of the contact piece 21, and the connecting pin 222 is located on a side away from the contact piece 21. For example, the contact piece 21 and the connecting portion 221 may be fixed by means of welding. Specifically, the welding can be laser welding, soldering, thermal compression welding, or the like. The laser welding is adopted in this embodiment. To facilitate welding the connecting portion 221 on the back of the contact piece 21, the connecting portion 221 is provided with a plurality of through holes. The contact piece 21 and the connecting piece 22 are respectively formed by means of stamping. Electroplating can be performed on the surface of the terminal 2. Electroplating can be performed on the contact piece 21 and the connecting piece 22 respectively before the contact piece 21 and the connecting portion 221 are fixed, or electroplating can be performed on the entire terminal 2 after the contact piece 21 and the connecting portion 221 are fixed. In this embodiment, the electroplating adopts continuous plating.

Figure 2:
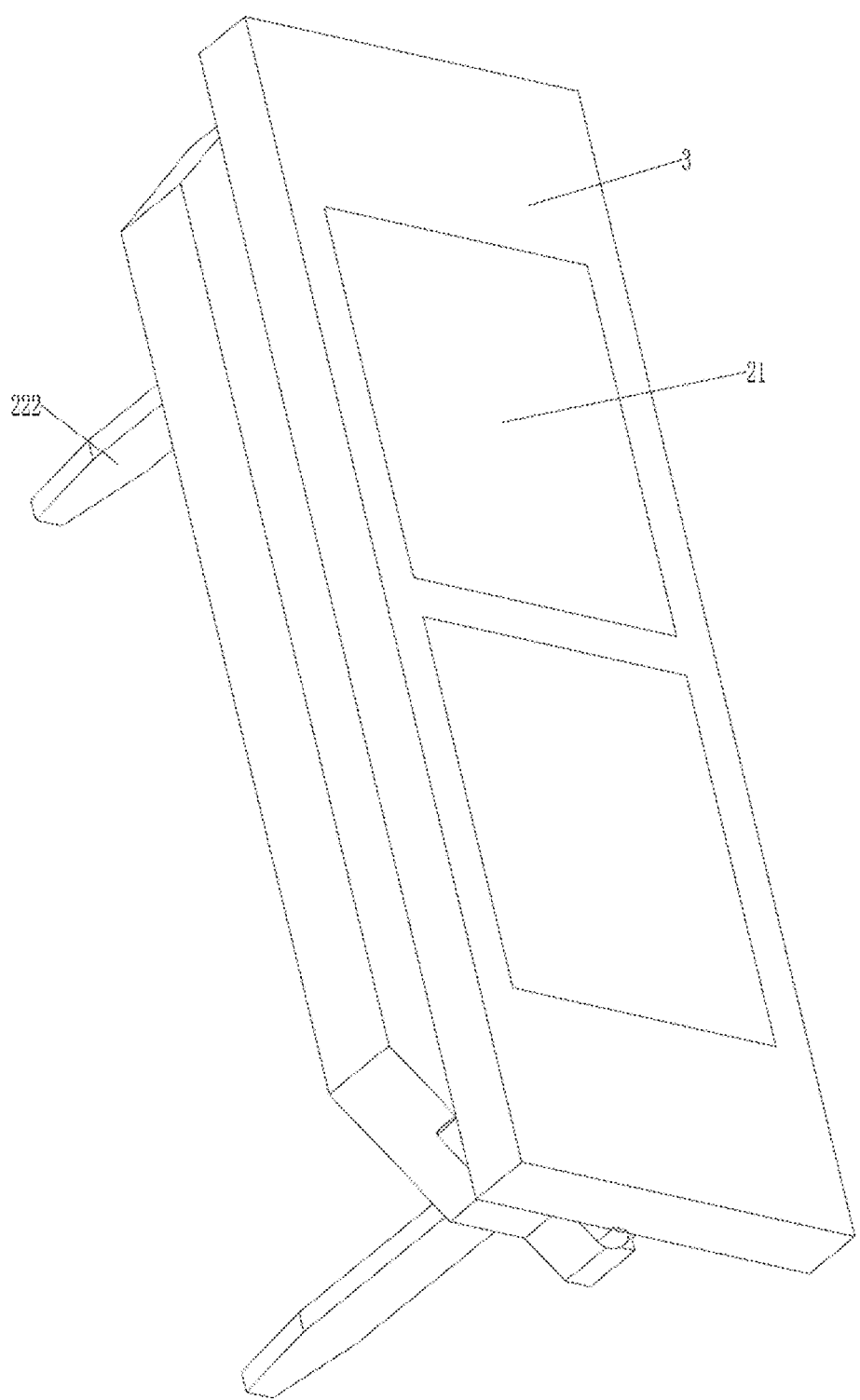
FIG. 2 is a schematic structural diagram of a terminal and an insulated block according to an embodiment from an angle of view.
Figure 3:
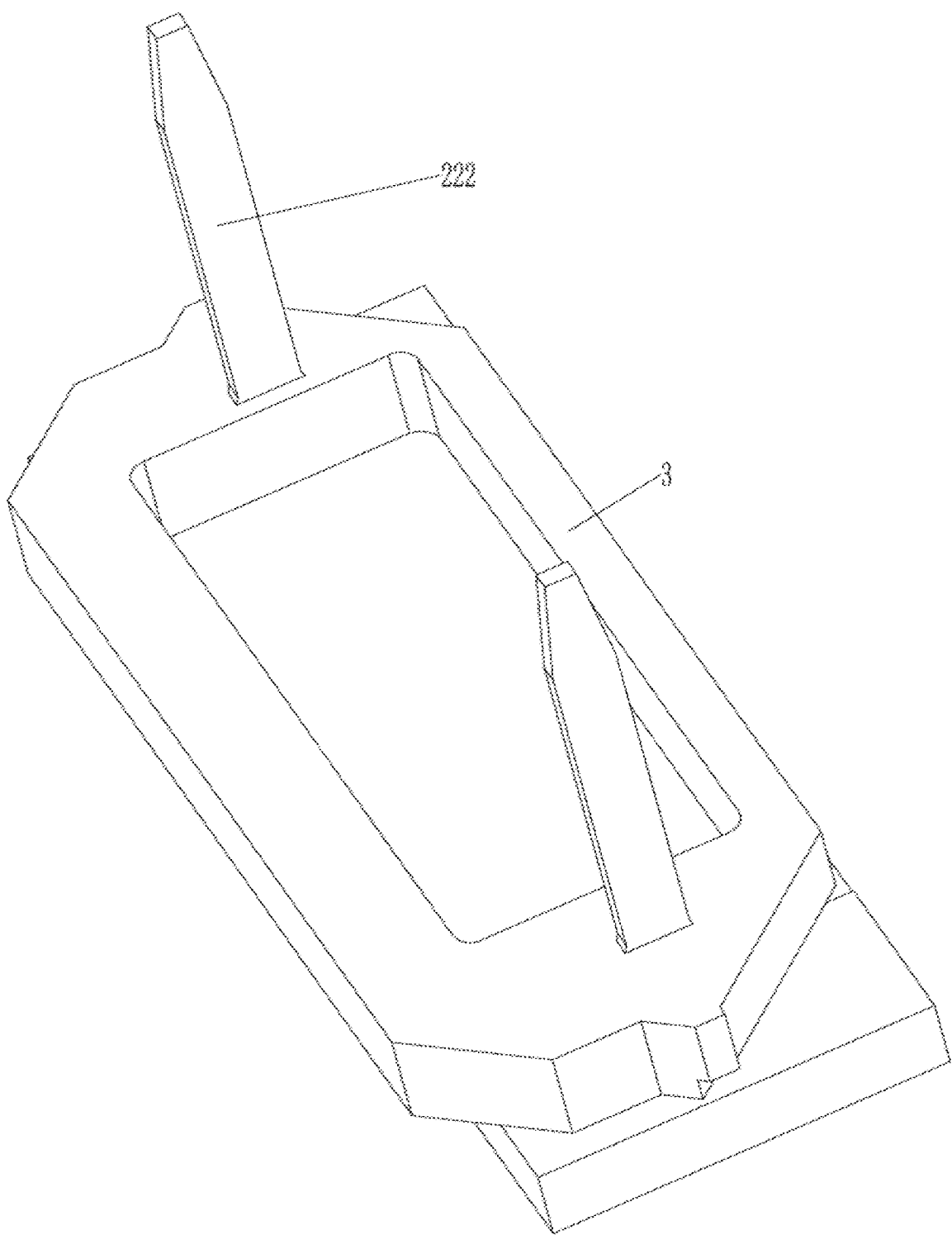
FIG. 3 is a schematic structural diagram of a terminal and an insulated block according to an embodiment from another angle of view.
Figure 4:
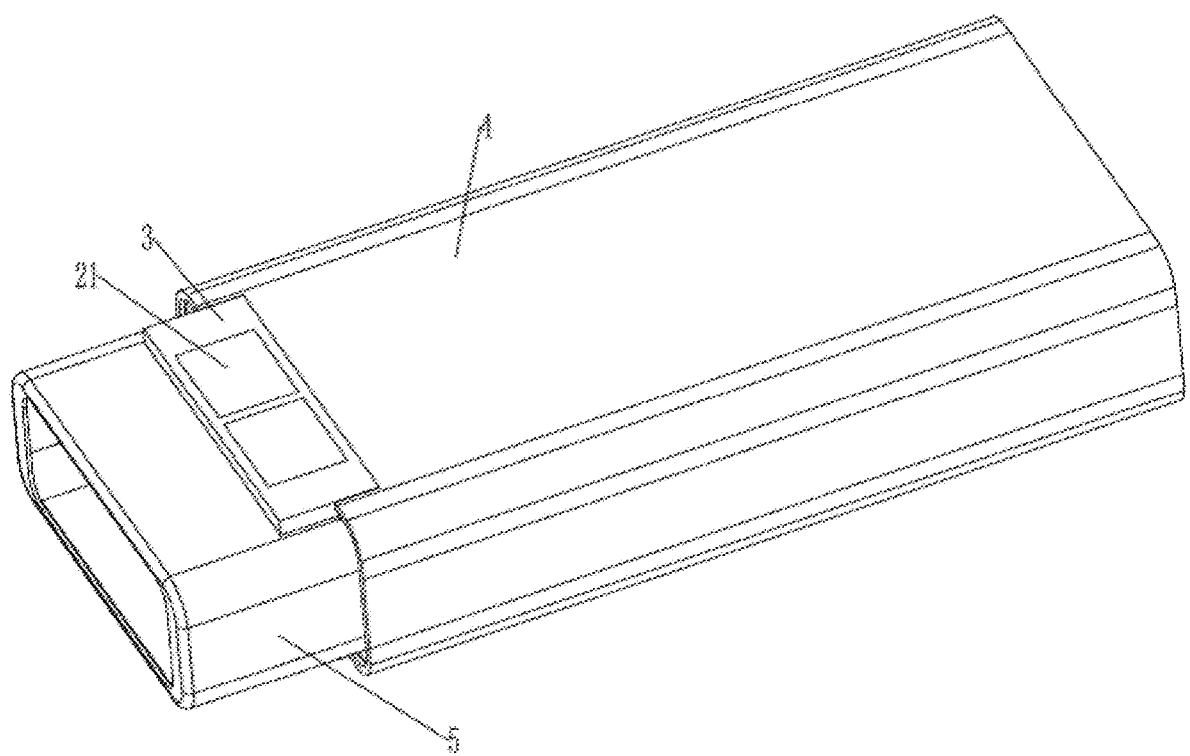
FIG. 4 is a schematic structural diagram of a connector according to an embodiment from an angle of view.

As shown in FIG. 2 to FIG. 4, the insulated block 3 is disposed at one side of the shell assembly, the insulated block 3 is provided with a groove for receiving the connecting portion 221 and the contact piece 21, and the connecting pin 222 passes through the insulated block 3 to be connected to the circuit board. In this embodiment, the connecting pin 222 is directly connected to the circuit board. However, in other embodiments, the connecting pin 222 can be indirectly connected to the circuit board. For example, the connecting pin 222 is electrically connected to the circuit board by using other conducting elements. A part of the contact piece 21 is exposed out of the groove, so that a bad contact between the connector and a butting connector can be avoided. The contact piece 21 and the connecting piece 22 are fixed in the insulated block 3 by means of insert molding. In this embodiment, two terminals 2 are fixed on the insulated block 3.

The connecting portion 221 and a bending portion of the connecting piece 22 are both embedded in the insulated block 3. The periphery of the contact piece 21 is devoid of material receiving areas. The contact area of the contact piece 21 has a pleasing appearance. Moreover, as the bending portion is completely embedded in the insulated block 3, insufficient molding and burr phenomenon during molding can be avoided.

As shown in FIG. 4, the shell assembly includes an outer shell 4 and a protection sleeve 5, the protection sleeve 5 is located at a front end of the outer shell 4, and a rear end of the protection sleeve 5 is disposed in the outer shell 4.

This embodiment further discloses a connector processing method. The processing method mainly aims at a processing of the foregoing connector and includes the following steps:

A contact piece 21 and a connecting piece 22 are formed respectively by means of stamping, and a connecting portion 221 of the connecting piece 22 is fixed on the back of the contact piece 21 to form a terminal 2. For example, the contact piece 21 and the connecting portion 221 can be fixed by means of welding, that is, the connecting portion 221 can be fixed on the back of the contact piece 21 by welding. Specifically, the welding can be laser welding, soldering, thermal compression welding, or the like. The laser welding is adopted to weld the connecting portion 221 on the back of the contact piece 21 in this embodiment. Electroplating can be performed on the terminal 2 after the contact piece 21 and the connecting portion 221 are fixed. In other embodiments, electroplating can be performed on the contact piece 21 and the connecting piece 22 respectively before the connecting portion 221 and the contact piece 21 are fixed, and then the connecting portion 221 of the connecting piece 22 is fixed on the back of the contact piece 21. In this embodiment, the electroplating adopts continuous plating.

The terminal 2 is fixed on the insulated block 3 by means of insert molding. In this embodiment, two terminals 2 are fixed on the insulated block 3.

The insulated block 3 is assembled on the shell assembly, and the connecting pin 222 of the connecting piece 22 is connected to a circuit board. The circuit board is assembled in the shell assembly. In this embodiment, the connecting pin 222 can be directly connected to the circuit board. However, in other embodiments, the connecting pin 222 can be indirectly connected to the circuit board. For example, the connecting pin 222 is electrically connected to the circuit board by using other conducting elements.

The connecting portion 221 and a bending portion of the connecting piece 22 of a connector processed by using the processing method are both embedded in the insulated block 3. The periphery of the contact piece 21 is devoid of material receiving areas. The contact area of the contact piece 21 has a pleasing appearance. Moreover, as the bending portion is completely embedded in the insulated block 3, insufficient molding and burr phenomenon during molding can be avoided. In addition, electroplating in such a forming method can adopt continuous plating. Pulling may be adopted for forming (the terminal 2 is a continuous material belt, which automatically feeds material into the forming mold, and what comes out after injection molding is also a continuous material belt), thereby improving production efficiency and reducing the cost.

Although the instant disclosure has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A connector, comprising a shell assembly and a circuit board disposed in the shell assembly, and further comprising:
    a terminal, wherein the terminal comprises a contact piece and a connecting piece, the connecting piece comprises a connecting portion and a connecting pin, an angle is between the connecting portion and the connecting pin, and the connecting portion is fixed on the back of the contact piece; and
    an insulated block, wherein the insulated block is disposed at one side of the shell assembly, the insulated block is provided with a groove for receiving the connecting portion and the contact piece, and the connecting pin passes through the insulated block to be connected to the circuit board.

2. The connector according to claim 1, wherein electroplating is performed on the surface of the terminal.

3. The connector according to claim 1, wherein the connecting portion is fixed on the back of the contact piece by welding.

4. The connector according to claim 3, wherein the welding is laser welding, soldering, or thermal compression welding.

5. A connector processing method applied to processing of the connector according to claim 1, comprising the following steps:
    forming the contact piece and the connecting piece by means of stamping, and fixing the connecting portion of the connecting piece on the back of the contact piece to form the terminal;
    fixing the terminal on the insulated block by means of insert molding; and
    assembling the insulated block on the shell assembly, and connecting the connecting pin of the connecting piece to the circuit board, wherein the circuit board is assembled in the shell assembly.

6. The connector processing method according to claim 5, wherein the connecting portion is fixed on the back of the contact piece by welding.

7. The connector processing method according to claim 6, wherein the welding is laser welding, soldering, or thermal compression welding.

8. The connector processing method according to claim 5, wherein before the connecting portion and the contact piece are fixed, electroplating is performed on the connecting portion and the contact piece respectively.

9. The connector processing method according to claim 8, wherein the electroplating adopts continuous plating.

10. The connector processing method according to claim 5, wherein after the connecting portion and the contact piece are fixed, electroplating is performed on the terminal.

11. The connector processing method according to claim 10, wherein the electroplating adopts continuous plating.

* * * * *